US009491852B2

(12) United States Patent
Lyon et al.

(10) Patent No.: US 9,491,852 B2
(45) Date of Patent: Nov. 8, 2016

(54) TRACE BORDER ROUTING

(75) Inventors: Benjamin B. Lyon, San Jose, CA (US);
Shih Chang Chang, San Jose, CA (US); Martin Paul Grunthaner, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 612 days.

(21) Appl. No.: 13/007,493

(22) Filed: Jan. 14, 2011

(65) Prior Publication Data
US 2012/0092273 A1 Apr. 19, 2012

Related U.S. Application Data

(60) Provisional application No. 61/393,818, filed on Oct. 15, 2010.

(51) Int. Cl.
*G06F 3/041* (2006.01)
*H05K 1/02* (2006.01)

(52) U.S. Cl.
CPC ........... *H05K 1/0265* (2013.01); *G06F 3/0412* (2013.01); *G06F 3/0416* (2013.01); *H05K 2201/0784* (2013.01); *H05K 2201/09727* (2013.01); *Y10T 29/49155* (2015.01)

(58) Field of Classification Search
CPC .......................... G20F 1/1345; G02F 1/13338
USPC .................................... 345/173, 174; 29/846
See application file for complete search history.

(56) References Cited

U.S. PATENT DOCUMENTS

| 3,773,989 A | 11/1973 | Hacon |
| 5,062,916 A | 11/1991 | Aufderheide et al. |
| 5,239,152 A | 8/1993 | Caldwell et al. |
| 5,483,261 A | 1/1996 | Yasutake |
| 5,488,204 A | 1/1996 | Mead et al. |
| 5,825,352 A | 10/1998 | Bisset et al. |
| 5,835,079 A | 11/1998 | Shieh |

(Continued)

FOREIGN PATENT DOCUMENTS

| CN | 1902538 A | 1/2007 |
| CN | 101162418 A | 4/2008 |

(Continued)

OTHER PUBLICATIONS

International Search Report mailed Jul. 23, 2009, for PCT Patent Application No. PCT/US2009/045843, filed Jun. 1, 2009, two pages.

(Continued)

*Primary Examiner* — Calvin C Ma
(74) *Attorney, Agent, or Firm* — Morrison & Foerster LLP (57) ABSTRACT

The border routing of conductive traces in devices, such as displays, touch sensor panels, and touch screens, to improve border area space usage, thereby reducing device size, and to reduce trace resistance, thereby improving device operation, is disclosed. The conductive traces can form a staggered stair-step configuration in the device border area, in which the average widths of the traces can be different from each other and each trace can have segments with different widths. The conductive traces can be coupled to an active area of the device to transmit signals to and from the active area in accordance with a device operation. The varying widths can help improve the border area space usage, reduce trace resistance, and reduce the differences in resistance between traces.

25 Claims, 7 Drawing Sheets

(56) References Cited

U.S. PATENT DOCUMENTS

| | | | |
|---|---|---|---|
| 5,869,791 A | 2/1999 | Young | |
| 5,880,411 A | 3/1999 | Gillespie et al. | |
| 5,994,766 A * | 11/1999 | Shenoy et al. | 257/659 |
| 6,188,391 B1 | 2/2001 | Seely et al. | |
| 6,297,811 B1 | 10/2001 | Kent et al. | |
| 6,310,610 B1 | 10/2001 | Beaton et al. | |
| 6,323,846 B1 | 11/2001 | Westerman et al. | |
| 6,690,387 B2 | 2/2004 | Zimmerman et al. | |
| 7,015,894 B2 | 3/2006 | Morohoshi | |
| 7,075,505 B2 * | 7/2006 | Sakaguchi et al. | 345/87 |
| 7,117,464 B2 * | 10/2006 | Frank et al. | 716/112 |
| 7,184,064 B2 | 2/2007 | Zimmerman et al. | |
| 7,321,362 B2 | 1/2008 | Bottari et al. | |
| 7,339,579 B2 | 3/2008 | Richter | |
| 7,423,621 B2 * | 9/2008 | Lin et al. | 345/98 |
| 7,663,607 B2 | 2/2010 | Hotelling et al. | |
| 7,705,952 B2 * | 4/2010 | Lee et al. | 349/151 |
| 7,755,176 B1 | 7/2010 | St. Amand et al. | |
| 8,179,353 B2 * | 5/2012 | Imajo et al. | 345/98 |
| 8,194,044 B2 | 6/2012 | Richter | |
| 8,255,830 B2 * | 8/2012 | Ording et al. | 715/810 |
| 8,479,122 B2 | 7/2013 | Hotelling et al. | |
| 9,069,418 B2 | 6/2015 | Grunthaner et al. | |
| 2003/0134095 A1 | 7/2003 | Bottari et al. | |
| 2004/0149377 A1 | 8/2004 | Bottari et al. | |
| 2005/0126831 A1 | 6/2005 | Richter | |
| 2006/0026521 A1 | 2/2006 | Hotelling et al. | |
| 2006/0087379 A1 | 4/2006 | Bartley et al. | |
| 2006/0189123 A1 | 8/2006 | Saitou et al. | |
| 2006/0197753 A1 | 9/2006 | Hotelling | |
| 2007/0115263 A1 * | 5/2007 | Taylor | G06F 1/1616 345/169 |
| 2007/0120471 A1 | 5/2007 | Yamazaki et al. | |
| 2007/0222763 A1 | 9/2007 | Spath | |
| 2007/0271399 A1 | 11/2007 | Peng et al. | |
| 2008/0100592 A1 | 5/2008 | Shigeno et al. | |
| 2008/0117182 A1 | 5/2008 | Um et al. | |
| 2008/0143683 A1 | 6/2008 | Hotelling | |
| 2008/0158181 A1 | 7/2008 | Hamblin et al. | |
| 2008/0165158 A1 | 7/2008 | Hotelling et al. | |
| 2008/0309633 A1 | 12/2008 | Hotelling et al. | |
| 2009/0091551 A1 | 4/2009 | Hotelling et al. | |
| 2009/0107736 A1 | 4/2009 | Ben-Eliyahu | |
| 2009/0143141 A1 | 6/2009 | Wells et al. | |
| 2009/0153509 A1 | 6/2009 | Jiang et al. | |
| 2009/0219258 A1 | 9/2009 | Geaghan et al. | |
| 2009/0266621 A1 | 10/2009 | Huang et al. | |
| 2009/0303189 A1 * | 12/2009 | Grunthaner | G06F 3/044 345/173 |
| 2009/0314621 A1 | 12/2009 | Hotelling | |
| 2010/0013800 A1 | 1/2010 | Elias et al. | |
| 2010/0079384 A1 | 4/2010 | Grivna | |
| 2010/0166287 A1 | 7/2010 | Ramer et al. | |
| 2011/0074705 A1 * | 3/2011 | Yousefpor et al. | 345/173 |
| 2011/0163764 A1 | 7/2011 | Shank et al. | |
| 2011/0298731 A1 * | 12/2011 | Fu et al. | 345/173 |
| 2013/0038572 A1 | 2/2013 | Frey et al. | |
| 2014/0139763 A1 | 5/2014 | Grunthaner et al. | |

FOREIGN PATENT DOCUMENTS

| | | | |
|---|---|---|---|
| JP | 03-015433 U | 2/1991 | |
| JP | 2000-163031 A | 6/2000 | |
| JP | 2002-342033 A | 11/2002 | |
| JP | 2004-296297 A | 10/2004 | |
| JP | 2008-009920 A | 1/2008 | |
| KR | 20020011716 A | 2/2002 | |
| NL | WO2005073791 * | 8/2005 | G02F 1/1345 |
| WO | WO-96/18179 A1 | 6/1996 | |
| WO | WO-2005/073791 A1 | 8/2005 | |
| WO | WO-2005/114369 A2 | 12/2005 | |
| WO | WO-2005/114369 A3 | 12/2005 | |
| WO | WO-2007/008518 A2 | 1/2007 | |
| WO | WO-2007/008518 A3 | 1/2007 | |
| WO | WO2007008518 * | 1/2007 | G06F 3/044 |
| WO | WO-2009/149014 A1 | 12/2009 | |

OTHER PUBLICATIONS

Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.

Rubine, D.H. (Dec. 1991). "The Automatic Recognition of Gestures," CMU-CS-91-202, Submitted in Partial Fulfillment of the Requirements for the Degree of Doctor of Philosophy in Computer Science at Carnegie Mellon University, 285 pages.

Rubine, D.H. (May 1992). "Combining Gestures and Direct Manipulation," CHI '92, pp. 659-660.

Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

European Search Report mailed Feb. 4, 2013, for EP Patent Application No. 12195666.8, five pages.

Non-Final Office Action mailed Jun. 19, 2013, for U.S. Appl. No. 12/135,038, filed Jun. 6, 2008, 9 pages.

European Search Report mailed Apr. 19, 2012, for EP Patent Application No. 12158277.9, four pages.

Final Office Action mailed Apr. 19, 2012, for U.S. Appl. No. 12/135,038, filed Jun. 6, 2008, eight pages.

Non-Final Office Action mailed Sep. 29, 2011, for U.S. Appl. No. 12/135,038, filed Jun. 6, 2008, seven pages.

Final Office Action mailed Nov. 6, 2013, for U.S. Appl. No. 12/135,038, filed Jun. 6, 2008, 14 pages.

European Search Report mailed Oct. 28, 2014, for EP Patent Application No. 14168254.2, three pages.

Non-Final Office Action mailed Sep. 17, 2014, for U.S. Appl. No. 12/135,038, filed Jun. 6, 2008, seven pages.

Notice of Allowance mailed Mar. 12, 2015, for U.S. Appl. No. 12/135,038, filed Jun. 6, 2008, ten pages.

Non-Final Office Action mailed May 6, 2015, for U.S. Appl. No. 14/163,899, filed Jan. 24, 2014, 14 pages.

Chinese Search Report mailed May 6, 2015, for CN Patent Application No. 201210581912.3, filed Jun. 1, 2009, with English translation, four pages.

Final Office Action mailed Jan. 14, 2016, for U.S. Appl. No. 14/163,899, filed Jan. 24, 2014, 17 pages.

Notice of Allowance mailed Aug. 12, 2016, for U.S. Appl. No. 14/163,899, filed Jan. 24, 2014, ten pages.

* cited by examiner

TRACE BORDER ROUTING

CROSS REFERENCE TO RELATED APPLICATIONS

This application claims benefit of U.S. Provisional Application No. 61/393,818, filed Oct. 15, 2010, the entire contents of which are incorporated by reference herein

FIELD

This relates generally to conductive traces and more particularly to improved routing of conductive traces in a border area of a device.

BACKGROUND

Many types of devices are presently available for performing operations in a computing system, such as displays, touch sensor panels, and touch screens. Displays can display graphics and/or text information to a user. Touch sensor panels can sense an object, e.g., the user's hand, touching or hovering over the panel, causing the computing system to perform some operation based on the touch or hover. Touch screens can include both a display and a touch sensor panel and can allow a user to perform various functions by touching or hovering over the touch sensor panel at a location dictated by a user interface (UI) being displayed by the display, causing the computing system to perform some operation based on the touch or hover and in accordance with the graphics and/or text information appearing at the time of the touch or hover.

Portable computing systems are becoming increasingly popular because of their ease and versatility of operation, mobility, and declining price. As such, it is desirable to produce a smaller, thinner system, while maintaining easy and versatile operation.

SUMMARY

This relates to border routing of conductive traces in devices, such as displays, touch sensor panels, and touch screens, to improve border area space usage, thereby reducing device size, and to reduce trace resistance, thereby improving device operation. The conductive traces can form a staggered stair-step configuration in which the average widths of the traces can be different from each other and each trace can have segments with different widths. The conductive traces can be coupled to an active area of the device to transmit signals to and from the active area in accordance with an operation of the device. The varying widths can help improve the border area space usage, reduce trace resistance, and reduce the differences in resistance between traces. This border routing can advantageously provide smaller border areas and improved device performance.

DETAILED DESCRIPTION

In the following description of example embodiments, reference is made to the accompanying drawings in which it is shown by way of illustration specific embodiments that can be practiced. It is to be understood that other embodiments can be used and structural changes can be made without departing from the scope of the various embodiments.

This relates to border routing of conductive traces in devices, such as displays, touch sensor panels, and touch screens, to optimize or otherwise improve border area space usage, thereby reducing device size, and to minimize or otherwise reduce trace resistance, thereby improving device operation. The conductive traces can form a staggered stair-step configuration in which the average widths of the traces can be different from each other and each trace can have segments with different widths. The conductive traces can be coupled to an active area of the device to transmit signals to and from the active area in accordance with a device operation. The varying widths can help optimize or improve the border area space usage, minimize or reduce trace resistance, and minimize or reduce the differences in resistance between traces. This border routing can advantageously provide smaller border areas and improved device performance.

Figure 1:
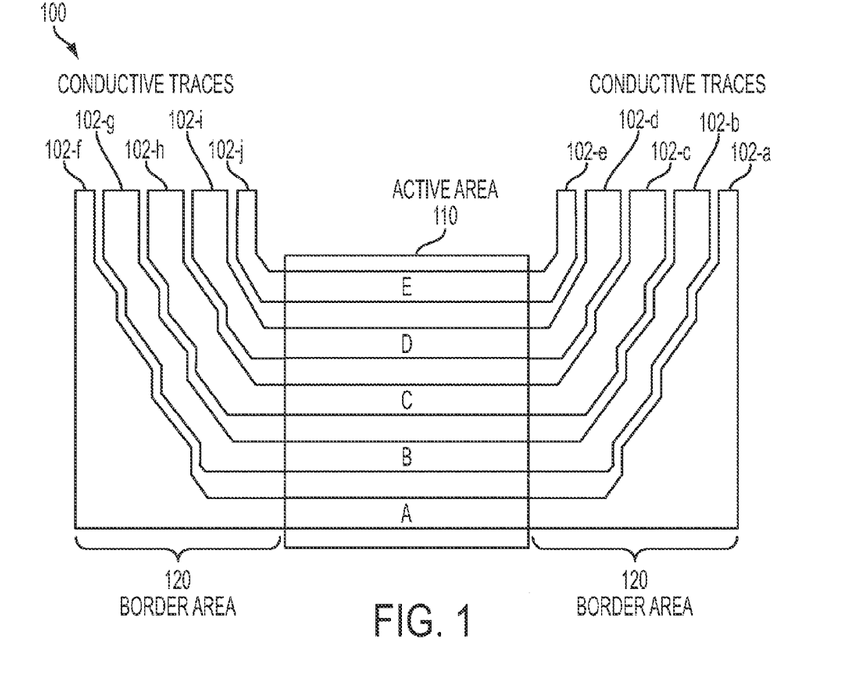
FIG. 1 illustrates an exemplary device having border routing of conductive traces according to various embodiments.

FIG. 1 illustrates an exemplary device having border routing of conductive traces according to various embodiments. In the example of FIG. 1, electronic device 100 can include active area 110 for performing an operation of the device and border area 120 for routing conductive traces 102 between the active area and signal processing circuitry (not shown). The conductive traces 102 can transmit electrical signals to and from the active area 110 in association with the performing operation. Each conductive trace 102 can be coupled to a particular location of the active area 110 and routed in the border area 120 from that location to the signal processing circuitry. For example, conductive traces 102-*a*, 102-*f* can be coupled to location A of the active area 110 to transmit signals to and from this location and can be routed in the border area 120 to the signal processing circuitry, which is disposed above location E in this example. Conductive traces 102-*b*, 102-*g* can be coupled to location B of the active area 110 to transmit signals to and from this location and can be in the border area 120 from this location up to the signal processing circuitry. Conductive traces 102-*c*, 102-*h* can be coupled to location C of the active area 110 to transmit signals to and from this location and can be routed in the border area 120 from this location up to the signal processing circuitry. Conductive traces 102-*d*, 102-*i* can be coupled to location D of the active area 110 to transmit signals to and from this location and can be routed in the border area 120 from this location up to the signal processing circuitry. Conductive traces 102-*e*, 102-*j* can be coupled to location E of the active area 110 to transmit signals to and from this location and can be routed in the border area 120 from this location up to the signal processing circuitry.

Trace resistance can be a function of trace width. Generally, the wider the conductive trace, the lower the resistance. In this example, each trace can be formed to have segments with various widths to reduce the trace's resistance. Trace resistance can also be a function of trace length. Generally, the longer the conductive trace, the higher the resistance. In this example, conductive traces 102-*a*, 102-*f* are the longest traces, conductive traces 102-*e*, 102-*j* are the shortest traces, and the other conductive traces have lengths therebetween. Since different trace lengths can result in different resistances and hence different transmission rates (among other undesirable conditions), the widths of the conductive traces 102 can be formed to substantially reduce or eliminate the differences in resistance between the traces. In this example, the segment widths in each trace can be formed to be different from the segment widths in another trace based on how much resistance difference needs to be reduced or eliminated. The trace widths can also be formed to make optimal use of the width of the border area 120 in accordance with the number of traces present at any location along the length of the border area. Accordingly, the trace widths can be formed to reduce the trace's resistance, minimize resistance differences between traces, and optimize border area space for the traces and any other electrical requirements.

As such, looking at the right-side border area 120, at location A where only one conductive trace 102-*a* is present, the trace width can be formed to essentially fill the border area space and reduce the trace's resistance. At location B, two conductive traces 102-*a*, 102-*b* are present, so the widths of the two traces can be formed to optimize border area space between the two traces while reducing each trace's resistance and resistance differences between the traces. At location C, three conductive traces 102-*a*, 102-*b*, 102-*c* are present, so the widths of the three traces can be formed to optimize border area space between the three traces and to reduce each trace's resistance and resistance differences between the traces. At location D where four conductive traces 102-*a*, 102-*b*, 102-*c*, 102-*d* are present, the trace widths can be formed to optimize border area space between the four traces and to reduce each trace's resistance and resistance differences between the traces. At location E, all five conductive traces 102-*a*, 102-*b*, 102-*c*, 102-*d*, 102-*e* are present, so the widths can be formed to optimize border area space between the five traces and to reduce each trace's resistance and resistance differences between the traces. The result can be a staggered stair-step configuration of the conductive traces 102.

In this stair-step configuration example of FIG. 1, conductive trace 102-*a* can have five segments (one at each location A through E) in which one or more of the segments have different widths. For example, the width at location A can be widest, the width at adjacent location B can be somewhat narrower, the width at adjacent location C can be even narrower, the width at adjacent location D can be narrower still, and the width at adjacent location E can be narrowest, resulting in a stair-step configuration for trace 102-*a*. Conductive trace 102-*b* can have four segments (one at each location B through E) in which one or more of the segments have different widths, resulting in its stair-step configuration. Conductive trace 102-*c* can have three segments (one at each location C through E) in which one or more of the segments have different widths, forming its stair-step configuration. Conductive trace 102-*d* can have two segments (one at each location D and E) in which the two segments can have different widths in the stair-step configuration. The same configuration can be applicable for conductive traces 102-*f* through 102-*j*.

Moreover, in this stair-step configuration example of FIG. 1, at location B, the widths of the segments for conductive traces 102-*b*, 102-*a* can be different. At location C, one or more of the widths of the segments for conductive traces 102-*c*, 102-*b*, 102-*c* can be different. At location D, one or more of the widths of the segments for conductive traces 102-*d*, 102-*c*, 102-*b*, 102-*a* can be different. At location E, one or more of the widths of the segments for conductive traces 102-*e*, 102-*d*, 102-*c*, 102-*b*, 102-*a* can be different. The same configuration can be applicable for conductive traces 102-*f* through 102-*j*.

As a result, in some embodiments, the average widths (i.e., the average of the segment widths) of each trace 102 on one side of the border area 120 can be different. Whereas, each pair of conductive traces 102 coupled to the same location on opposite sides of active area 110 can have the same or similar average width. Additionally, each pair can have the same or similar corresponding individual segment widths.

For the conductive traces that span multiple locations, e.g., traces 102-*a*, 102-*b*, 102-*c*, 102-*d*, 102-*f*, 102-*g*, 102-*h*, 102-*i*, the widths of the trace segments at all the other locations can be taken into account when setting a segment width at a particular location to ensure that the trace's resistance is reduced to an optimal or preferable level. For example, conductive trace 102-*a* spans all five locations A through E. As such, to ensure that the trace's resistance is reduced to an optimal or preferable level, when determining the segment width at location E, the previously determined segment widths at locations A through D can be used to assess what segment width at location E would result in the optimal or preferred resistance.

Determining appropriate trace segment widths to be formed at each location can be an iterative process, particularly when there are multiple electrical requirements to be met, e.g., to minimize a trace's resistance, while minimizing resistance differences between traces, while optimizing border area space. As such, there can be tradeoffs between how low the trace resistance can be, how many of the traces can have matching or near matching resistances, and how little of the border area space can be used. Ideally, a goal can be to find the maximum resistance among the traces within the width constraints of the border area and then determine widths of the other traces to be at or below that resistance within the width constraints of the border area. In some embodiments, an optimization algorithm can be used to balance these (and any other) electrical requirements and calculate optimal or preferable segment widths for each trace at each location. These calculated trace segment widths can then be formed in the border areas of the device.

Optimizing the border area space does not necessarily require that all the border area be filled by the trace widths. Rather, in some embodiments, trace widths can be narrower than the border area optimum so as to avoid parasitic coupling with proximate components in the active area. Or in some embodiments, larger spacing between the active area and the traces can be made to avoid the parasitic coupling.

In this example of FIG. 1, the conductive traces 102 are shown in the border area 120 on both sides of the active area 110. However, it is to be understood that the conductive traces 102 can be in the border area on only one side of the active area 110. That way, electrical signals can be transmitted to and from the active area 110 on one side in associated with the performing operation.

Also, each active area location has a conductive trace coupled thereto. However, it is to be understood that other coupling are also possible. For example, the conductive traces 102 can be interleaved on both sides of the active area 110, such that some conductive traces 102 can couple at locations A, C, and E in the border area 120 on one side of the active area 110 and other conductive traces can couple at locations B and D in the border area on the other side of the active area. That way, more border space can be available for widening the traces. The interleaved conductive traces 102 on both sides can have the stair-step configuration and can form widths to reduce trace resistance and to optimize border area space, as previously described.

Figure 2:
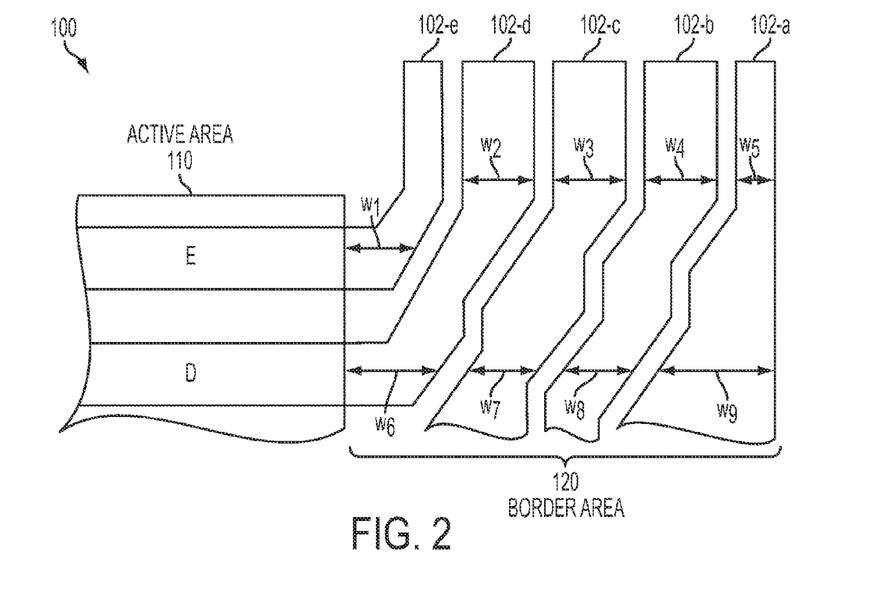
FIG. 2 illustrates an exemplary border routing of the conductive traces of FIG. 1 according to various embodiments.

FIG. 2 illustrates a close up view of the border routing of the conductive traces of FIG. 1 according to various embodiments. In the example of FIG. 2, at location E, the segment widths w1, w2, w3, w4, w5 (not drawn to scale) of the conductive traces 102 can be formed as previously described. In some embodiments, the widths can be different based what's needed to reduce the trace's resistance. For example, the shortest trace 102-e can form a narrower width w1 to overcome a smaller trace resistance. The longest trace 102-a can also form a narrower width w5 because much of the trace's resistance reduction has been accounted for in the trace widths at other locations A-D. Whereas trace 102-d can have a wider width w2 than trace 102-e to overcome a larger trace resistance. In alternate embodiments, the widths can be the same. At location D, the segment widths w6, w7, w8, w9 (not drawn to scale) of the conductive traces 102 can also be formed as previously described. In some embodiments, the widths can be different based on what's needed to reduce the trace's resistance. In alternate embodiments, the widths can be the same. For those traces that span locations D and E, their widths in the two locations can be the same or different based on what's needed to reduce the trace's resistance. For example, trace 102-d can have either different or same widths w2, w6.

Figure 3:
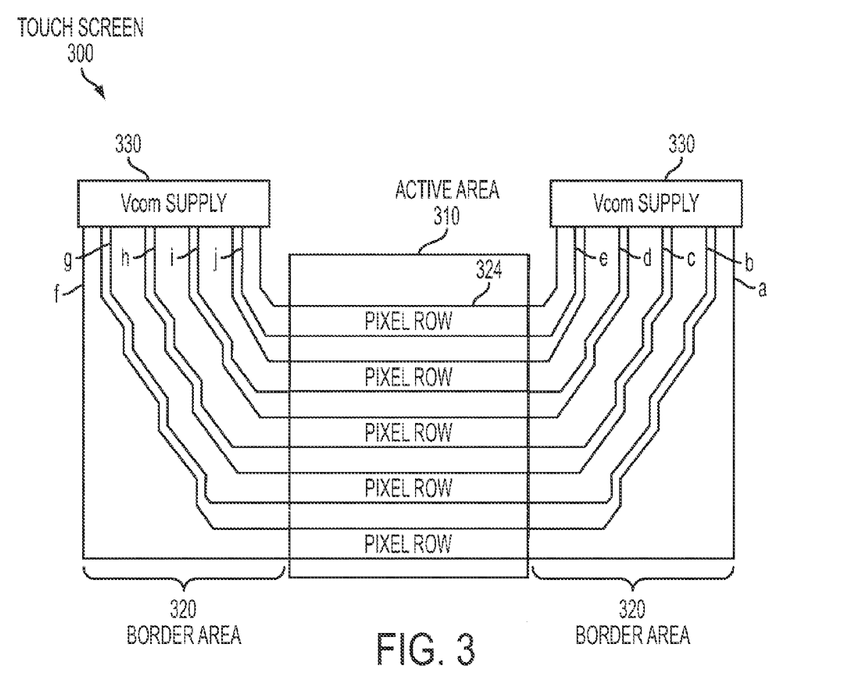
FIG. 3 illustrates an exemplary touch screen having border routing of common electrode voltage lines according to various embodiments.

FIGS. 3 through 7 illustrate exemplary devices having border routing of conductive traces according to various embodiments. In the example of FIG. 3, touch screen 300 can have border routing of common electrode voltage (Vcom) lines 302 for driving active area 310 according to various embodiments. The Vcom line 302 can have similar structures to conductive traces 102 of FIG. 1. The active area 310 of the touch screen 300 can include multiple rows 324 of integrated touch-display pixels. Each Vcom line 302 can transmit a voltage from Vcom supply 330 to a corresponding row 324 of pixels to stimulate the pixels to sense a touching or hovering object at the active area 310. As a consequence of reducing resistance in the border traces, this border routing can substantially reduce or eliminate crosstalk in sensed touch or hover signals in the touch screen 300 caused by stray display signals undesirably coupling with the Vcom lines 302 while sensing the touch or hover.

Figure 4:
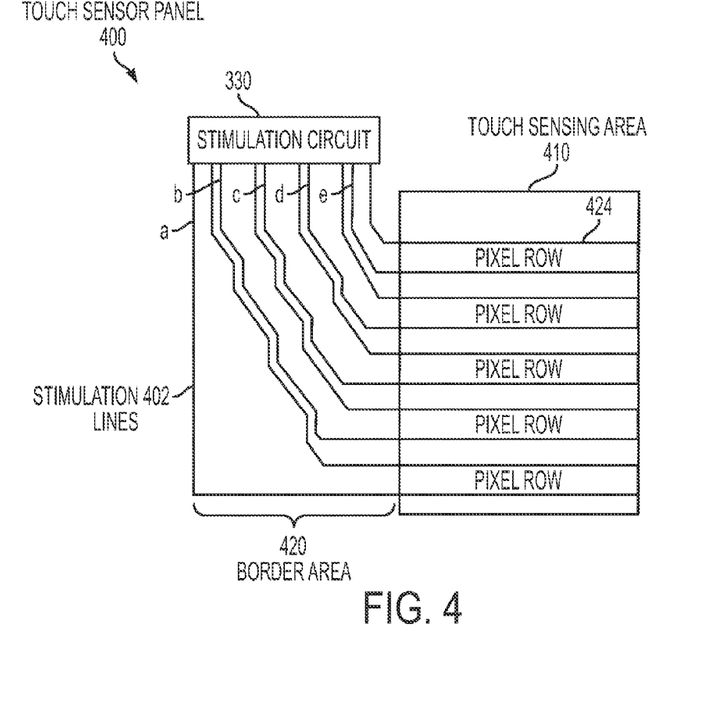
FIG. 4 illustrates an exemplary touch sensor panel having border routing of stimulation signal lines according to various embodiments.

In the example of FIG. 4, touch sensor panel 400 can have border routing of stimulation lines 402 for driving touch sensing area 410 according to various embodiments. The stimulation lines 402 can have similar structures to conductive traces 102 of FIG. 1. The touch sensing area 410 can include multiple rows 424 of touch pixels. Each stimulation line 402 can transmit a stimulation signal from stimulation circuitry 430 to a corresponding row 424 of touch pixels to stimulate the pixels to sense a touching or hovering object at the touch sensing area 410. Here, the stimulation lines 402 can form in the border area 420 on one side of the touch sensing area 410. This border routing can substantially reduce or eliminate undesirable parasitic capacitance and/or resistance that can adversely affect the sensed touch or hover signals.

In some embodiments, the touch sensor panel 400 can be disposed on a display to form a touch screen. The panel 400 can have similar border routing of the stimulation lines 402 to drive the panel. In addition to reducing capacitance and resistance, this border routing can also substantially reduce or eliminate crosstalk caused by the display in sensed touch or hover signals.

Figure 5:
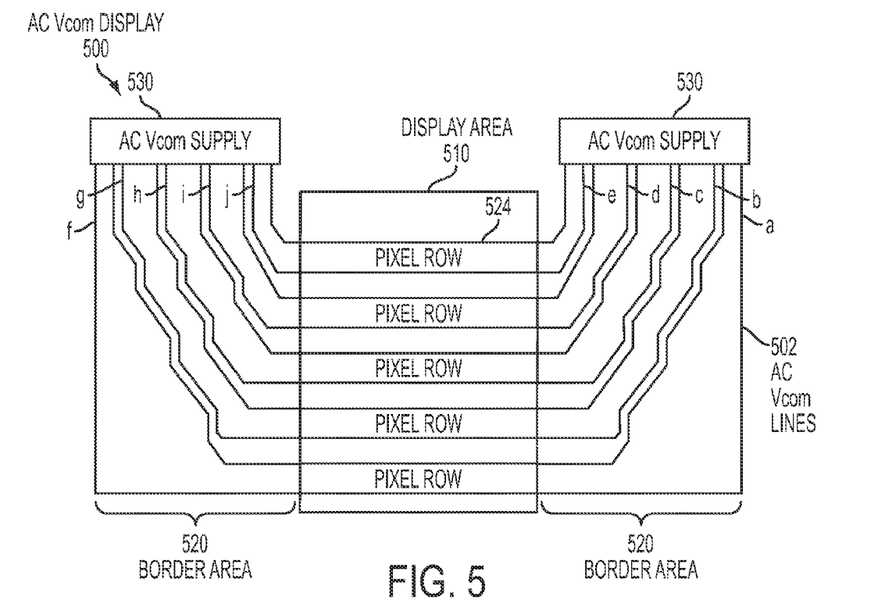
FIG. 5 illustrates an exemplary display having border routing of AC common electrode voltage lines according to various embodiments.

In the example of FIG. 5, display 500 can have border routing of AC driven Vcom lines 502 for driving display area 510 according to various embodiments. The AC Vcom lines 502 can have similar structures to conductive traces 102 of FIG. 1. The display area 510 can include multiple rows 524 of display pixels. Each AC Vcom line 502 can transmit an AC voltage from Vcom supply 530 to drive the pixels to display graphics and/or text information. This border routing can effectively replace a thick conductive trace surrounding the display area in traditional AC Vcom displays used to ensure that the applied voltage is uniform across the display area. As a result, the border routing can optimize border area space as well as ensure the uniformity of the applied voltage.

Figure 6:
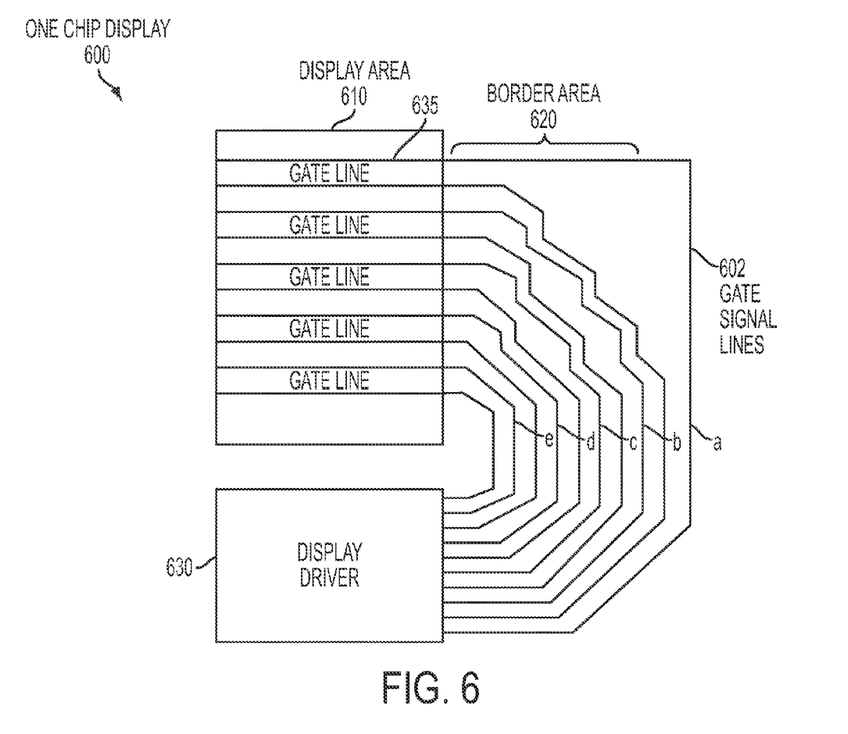
FIG. 6 illustrates an exemplary one chip display having border routing of gate signal lines according to various embodiments.

In the example of FIG. 6, one chip display 600 can have border routing of gate signal lines 602 for driving display area 610 according to various embodiments. The signal lines 602 can have similar structures to conductive traces 102 of FIG. 1. The display area 610 can include multiple gate lines 635 in display pixels to drive the pixels to display graphics and/or text information. Each gate signal line 602 can transmit a gate signal from display driver 630 to drive the pixels. Here, the gate signal lines 602 can form in the border area 620 on one side of the display area 610. This border routing can optimize border area space as well as reduce the signal lines' resistance.

Figure 7:
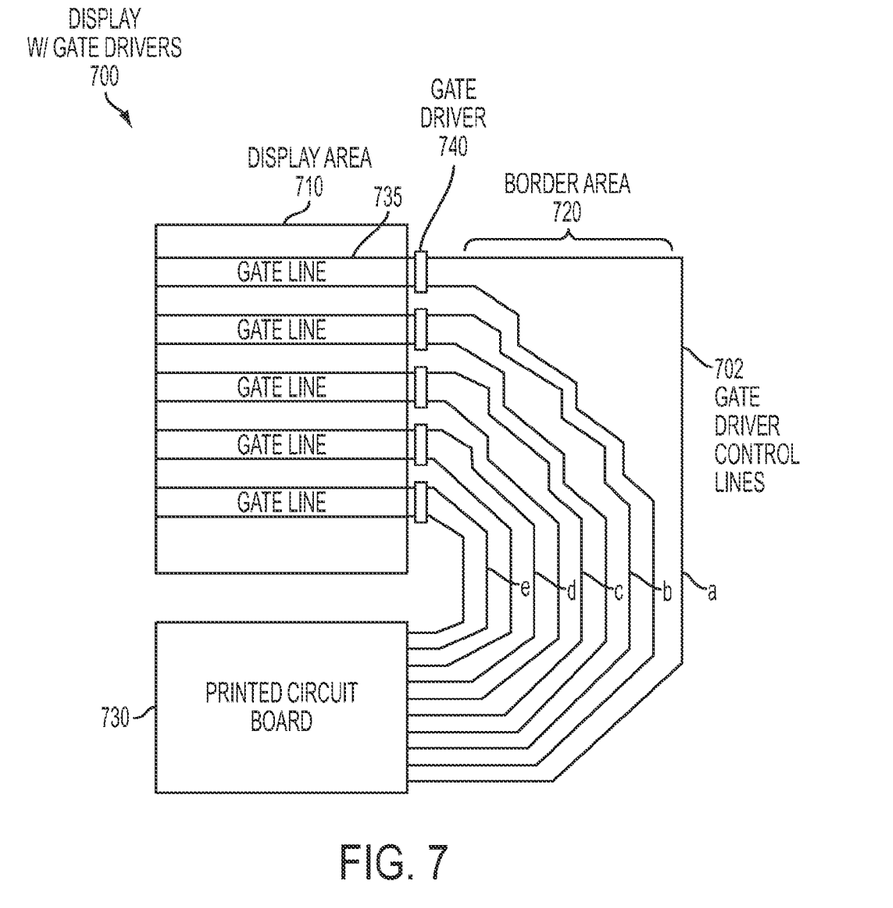
FIG. 7 illustrates an exemplary display with gate drivers having border routing of gate driver control lines according to various embodiments.

In the example of FIG. 7, display 700 can have border routing of gate driver control lines 702 for driving gate drivers 740 according to various embodiments. The control lines 702 can have similar structures to conductive traces 102 of FIG. 1. The gate drivers 740 can drive gate lines 735 in display pixels to drive the pixels to display graphics and/or text information. Each gate driver 740 can be coupled to a corresponding gate line 735. Printed circuit board (PCB) 730 can transmit signals along control lines 702 to control the gate drivers 740 according to the display requirements. Here, the control lines 702 can form in the border area 720 on one side of the display area 710. This border routing can optimize border area space as well as reduce the control lines' resistance.

It is to be understood that border routing is not limited to the devices of FIG. 3 through 7, but can include any devices having border area space constraints and/or conductive trace resistance needs according to various embodiments.

Figure 8:
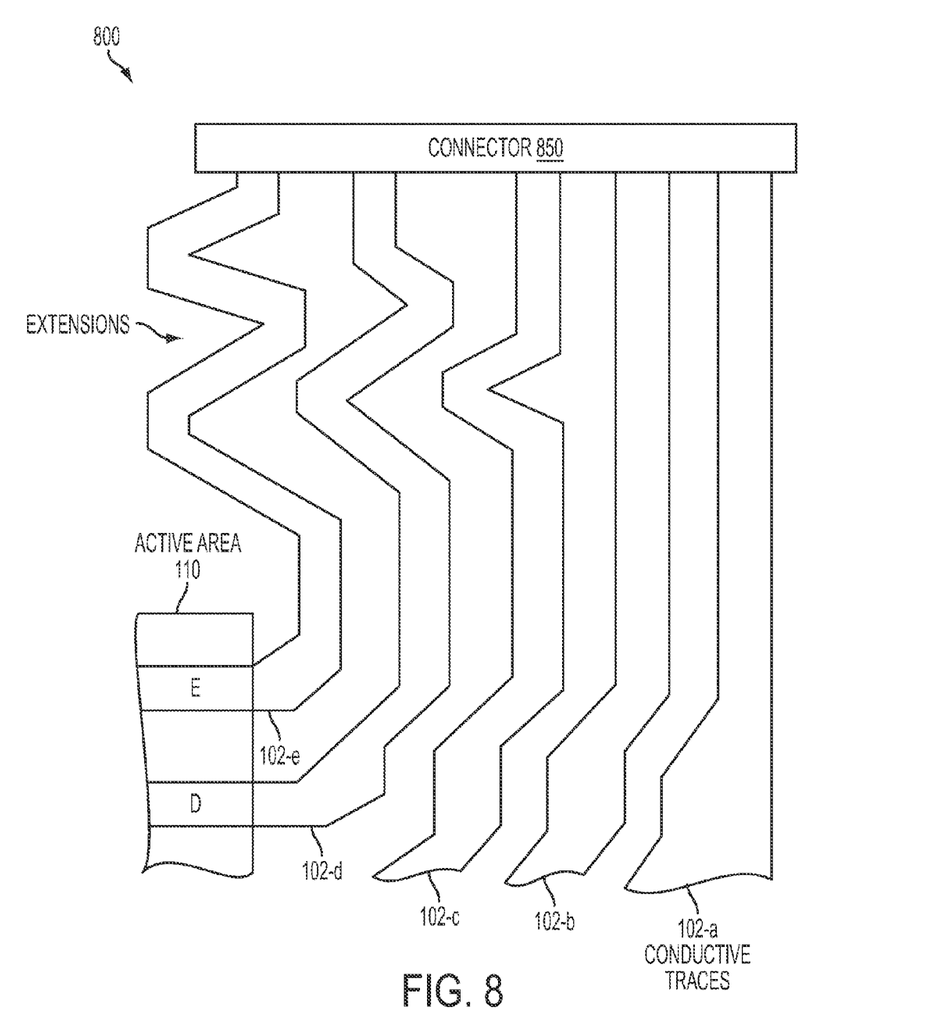
FIG. 8 illustrates an exemplary border routing of the conductive traces of FIG. 1 with extended distal ends according to various embodiments.

As described previously, trace resistance can be a function of trace length, where the longer the trace, the higher the resistance. In FIG. 1, the disparity between the lengths of conductive traces 102-*e* and 102-*a* is significant such that it can be difficult to substantially match the resistances of the two traces (if indeed such a match is an electrical requirement of the device). FIG. 8 illustrates a close up view of an exemplary border routing of the conductive traces of FIG. 1 that addresses this issue. In the example of FIG. 8, conductive trace 102-*e* can have extra length (extensions to the traces having one or more bends) in the border area above the active area 110 to increase its length and thereby its resistance closer to that of the other traces. Conductive traces 102-*d* and 102-*c*, the next shorter traces, can similarly have extra length (though not as much as trace 102-*e*) in the border area above the active area 110 to increase its resistance closer to that of the other traces. Conductive traces 102-*a* and 102-*b*, the longer traces, can omit extra length since their resistance can more likely be the highest of the traces. Connector 850 can connect the traces 102 to signal processing circuitry (not shown).

Figure 9A:
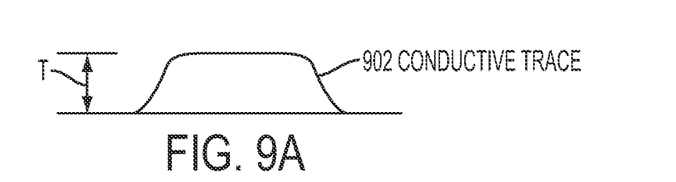
FIGS. 9a through 9c illustrate exemplary stackups of conductive traces that can have border routing according to various embodiments.
Figure 9B:
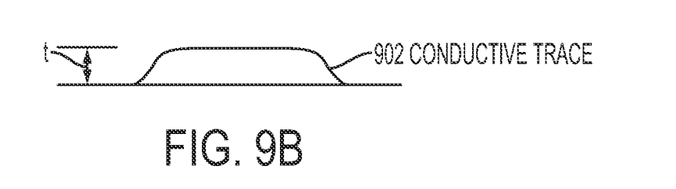
Figure 9C:
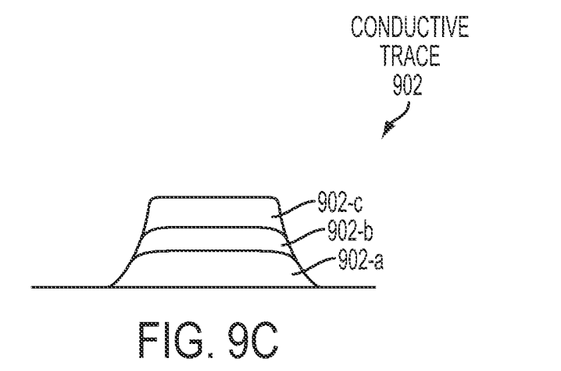

FIGS. 9*a* through 9*c* illustrate exemplary stackups of conductive traces that can have border routing according to various embodiments. The thickness and material makeup of the conductive traces can be varied to meet the electrical requirements of the device. In the example of FIG. 9*a*, a single layer of conductive material having a thickness T can be used, for example, for shorter traces to match longer traces' resistance. In the example of FIG. 9*b*, a single layer of conductive material having a thickness t can be used, for example, for longer traces to reduce the traces' resistance. Alternatively, a single layer of material with higher resistivity can be used in some instances and a single layer of material with lower resistivity can be used in other instance. In the example of FIG. 9*c*, a multi-layer stackup having different materials having higher resistivity, lower resistivity, or both can be used as an alternative to adjusting the thickness of the trace. Example trace materials include Molybdenum/Niobium (Mo/Nb), which has higher resistivity, and Aluminum/Neodymium (Al/Nd), which has lower resistivity.

Figure 10:
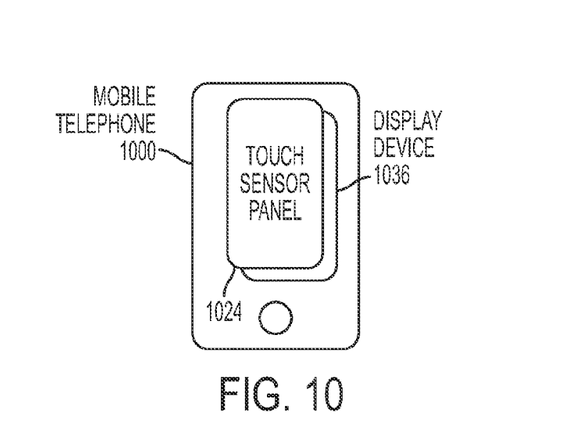
FIG. 10 illustrates an exemplary mobile telephone having a display that includes border routing of conductive traces according to various embodiments.

FIG. 10 illustrates exemplary mobile telephone 1000 that can include touch sensor panel 1024 and display device 1036, the touch sensor panel and/or the display device including conductive traces formed in their border areas according to various embodiments.

Figure 11:
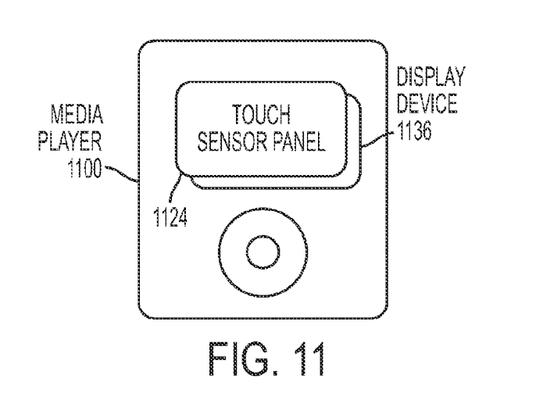
FIG. 11 illustrates an exemplary digital media player having a display that includes border routing of conductive traces according to various embodiments.

FIG. 11 illustrates exemplary digital media player 1100 that can include touch sensor panel 1124 and display device 1136, the touch sensor panel and/or the display device including conductive traces formed in their border areas according to various embodiments.

Figure 12:
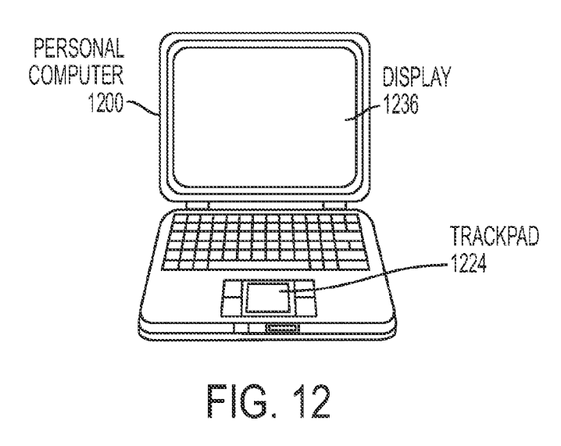
FIG. 12 illustrates an exemplary personal computer having a display that includes border routing of conductive traces according to various embodiments.

FIG. 12 illustrates exemplary personal computer 1200 that can include trackpad 1224 and display 1236, the trackpad and/or the display including conductive traces formed in their border areas according to various embodiments.

The mobile telephone, media player, and personal computer of FIGS. 10 through 12 can be more compact and have improved performance with conductive trace border routing according to various embodiments.

Although embodiments have been fully described with reference to the accompanying drawings, it is to be noted that various changes and modifications will become apparent to those skilled in the art. Such changes and modifications are to be understood as being included within the scope of the various embodiments as defined by the appended claims.

What is claimed is:

1. A display comprising:
   an active area configured to display data;
   a plurality of rows in the active area, each forming at least a portion of one or more display pixels;
   multiple conductive traces including inner conductive traces and outer conductive traces, the inner conductive traces located between the outer conductive traces, the multiple conductive traces in a plane disposed along a length of the plane, each trace electrically coupled to one of the plurality of rows, the traces having segments of different widths, each width perpendicular to the length in the plane, wherein the width of the trace is constant within each segment, and
   further wherein the inner conductive traces have greater widths than the outer conductive traces at a connector location, and at least one of the multiple conductive traces having segments that decrease in width with respect to one another along the length of the trace.

2. The display of claim 1, wherein the conductive traces comprise multiple gate signal lines, the display comprising:
   a display driver configured to transmit gate signals over the gate signal lines to the active area to cause the active area to display the data.

3. The display of claim 1, wherein the conductive traces comprise multiple gate driver control lines, the display comprising;
   multiple gate drivers configured to drive the active area to display the data; and
   a printed circuit board configured to transmit signals over the control lines to the gate drivers to cause the gate drivers to drive the active area.

4. The display of claim 1, wherein the conductive traces comprise multiple common voltage lines, the display comprising:
   a voltage supply configured to transmit AC voltage over the voltage lines to the active area to cause the active area to display the data.

5. The display of claim 1, wherein the traces form a stair-step configuration comprising:
   at a first location, a first conductive trace coupling at the active area to a first row of the plurality of rows; and
   at a second adjacent location, a second conductive trace coupling at the active area to a second row of the plurality of rows and a distal portion of the first coupled conductive trace adjacent to the second coupled conductive trace, the width of the first coupled conductive trace at the second location being smaller than the width of the first coupled conductive trace at the first location to form the stair-step configuration of the first coupled conductive trace.

6. The display of claim 1, wherein the conductive traces have different lengths and wherein shorter ones of the conductive traces have lines coupled thereto to extend the length of the shorter traces to match resistance of the shorter conductive traces to resistance of longer ones of the conductive traces.

7. The display of claim 1, wherein at least one of the conductive traces has a different thickness to match resistance with the other traces.

8. The display of claim 1, wherein at least one of the conductive traces comprises different conductive material so as to match resistance with the other traces.

9. The display of claim 1 incorporated into at least one of a mobile telephone, a digital media player, or a personal computer.

10. A touch sensor panel comprising:
multiple rows of touch pixels configured to sense a touch or hover;
multiple conductive traces including inner conductive traces and outer conductive traces, the inner conductive traces located between the outer conductive traces, the multiple conductive traces in a plane disposed along a length of the plane, each trace coupled to a different row and configured to drive a respective row with stimulation signals, the traces being disposed at a border area of the panel, each trace having segments with multiple widths that are different from the multiple widths of the segments of the other traces, the width perpendicular to the length in the plane, wherein the width of the trace is constant within each segment and further wherein the inner conductive traces have greater widths than the outer conductive traces at a connector location, and at least one of the multiple conductive traces having segments that decrease in width with respect to one another along the length of the trace.

11. The panel of claim 10, wherein at least two of the multiple widths in each trace are different.

12. The panel of claim 10, wherein the conductive traces are coupled in an interleaved manner to the rows, the traces coupling to every other row.

13. A touch screen comprising:
a display configured to display data;
a touch sensor panel including a plurality of rows configured to sense a touch or hover;
multiple conductive traces including inner conductive traces and outer conductive traces, the inner conductive traces located between the outer conductive traces, the multiple conductive traces in a plane disposed along a length of the plane, each trace coupled to a different row and configured to drive a respective row with stimulation signals, the traces being disposed at a border area of the panel, each trace having segments with multiple widths that are different from the multiple widths of the segments of the other traces, the width perpendicular to the length in the plane, wherein the width of the trace is constant within each segment, and further wherein the inner conductive traces are have greater widths than the outer conductive traces at a connector location, and at least one of the multiple conductive traces having segments that decrease in width with respect to one another along the length of the trace.

14. The screen of claim 13, wherein the conductive traces comprise common voltage drive lines for driving the panel with voltage signals to cause the panel to sense the touch or hover.

15. The screen of claim 13, wherein the conductive traces are coupled to both sides of the panel to drive the panel from both sides to cause the panel to sense the touch or hover.

16. The screen of claim 13, wherein the different average widths and the different segment widths of the conductive traces reduce interference between the display and the panel when the panel senses the touch or hover.

17. A method of forming conductive traces on a device, comprising:
forming multiple conductive traces in a plane along a length of the plane, in a border area of the device, the traces varying in length, each trace having at least two segments of different widths, the width perpendicular to the length in the plane, wherein the width of a trace is constant within each segment, wherein the multiple conductive traces includes inner conductive traces and outer conductive traces, the inner conductive traces located between the outer conductive traces, further wherein the inner conductive traces have greater widths than the outer conductive traces at a connector location;
forming an active area including a plurality of rows to couple to the conductive traces, each conductive trace coupling to a corresponding row in the active area to transmit signals to and from that row, wherein each row forms at least a portion of one or more display pixels;
forming three or more adjacent traces alongside a first location, each of the three or more adjacent traces having a different width as measured along a line perpendicular to the active area at the border area; and
at least one of the three or more traces having segments that decrease in width with respect to one another along a length of the trace.

18. The method of claim 17, wherein forming multiple conductive traces comprises forming the traces into a stair-step configuration including
at the first location in the active area, coupling a first conductive trace to a first row thereto; and
at a second adjacent location in the active area, coupling a second conductive trace to a second row thereto and disposing an adjacent distal portion of the first coupled conductive trace, the widths of the segments of the first coupled conductive trace being different at the first and second locations to form the stair-step configuration.

19. The method of claim 17, wherein forming multiple conductive traces comprises forming the different widths for the at least two segments of each trace to optimize space used by the traces in the border area.

20. The method of claim 17, wherein forming multiple conductive traces comprises forming the different widths for the at least two segments of each trace to reduce resistance in that trace.

21. The method of claim 17, wherein forming multiple conductive traces comprises forming the different widths for the at least two segments of each trace to cancel out parasitic capacitance in the device.

22. A method of routing conductive traces around a border of a device, comprising:
routing multiple conductive traces in a plane disposed along a length of the plane and formed in a border area of the device from corresponding active areas of the device, the traces having segments with varying widths, the width perpendicular to the length in the plane, wherein each trace is coupled to one of a plurality of rows forming at least a portion of one or more display pixels, the width of the trace is constant within each segment, and the widths satisfying at least one electrical requirement of the device,
wherein routing the multiple conductive traces comprises forming inner conductive traces having greater widths than the outer conductive traces at a connector location, the inner conductive traces located between the outer conductive traces, and at least one of the three or more traces having segments that decrease in width with respect to one another along a length of the trace.

23. The method of claim 22, wherein the at least one electrical requirement includes at least one of reduced resistance in the traces, reduced differences in resistance between the traces, or improved usage of the border area by the traces.

24. The method of claim 22, wherein routing multiple conductive traces comprises forming the different widths so that the traces have resistance at or below a maximum resistance permissible in accordance with the at least one electrical requirement.

25. The method of claim 22, comprising:
   prior to the routing, iteratively determining the different widths by repeating adjustments of the widths until the electrical requirement is satisfied.

\* \* \* \* \*